United States Patent
Kearney (10) Patent No.: US 11,177,818 B2
(45) Date of Patent: Nov. 16, 2021

(54) NON-QUADRATURE LOCAL OSCILLATOR MIXING AND MULTI-DECADE COVERAGE

(71) Applicant: Analog Devices International Unlimited Company, Limerick (IE)

(72) Inventor: Niall Kevin Kearney, Cork (IE)

(73) Assignee: Analog Devices International Unlimited Company, Limerick (IE)

( * ) Notice: Subject to any disclaimer, the term of this patent is extended or adjusted under 35 U.S.C. 154(b) by 191 days.

(21) Appl. No.: 16/546,753

(22) Filed: Aug. 21, 2019

(65) Prior Publication Data

US 2020/0067517 A1    Feb. 27, 2020

Related U.S. Application Data

(60) Provisional application No. 62/722,448, filed on Aug. 24, 2018.

(51) Int. Cl.
| | |
|---|---|
| H03H 7/30 | (2006.01) |
| H03H 7/40 | (2006.01) |
| H03K 5/159 | (2006.01) |
| H03L 7/185 | (2006.01) |
| H04L 27/00 | (2006.01) |
| H03D 7/16 | (2006.01) |
| H03L 7/099 | (2006.01) |
| H03D 3/00 | (2006.01) |
| H04B 1/00 | (2006.01) |
| H03L 7/093 | (2006.01) |

(52) U.S. Cl.
CPC ............ *H03L 7/185* (2013.01); *H03D 3/007* (2013.01); *H03D 7/166* (2013.01); *H03L 7/0992* (2013.01); *H04B 1/0014* (2013.01); *H04L 27/0014* (2013.01); *H03L 7/093* (2013.01); *H04L 2027/0016* (2013.01)

(58) Field of Classification Search
CPC ....... H03L 7/185; H03L 7/0992; H03L 7/093; H04L 27/0014; H04L 2027/0016; H03D 7/166; H03D 3/007; H04B 1/0014; H04B 1/0082
USPC ................ 375/235, 346, 316, 219, 220, 222
See application file for complete search history.

(56) References Cited

U.S. PATENT DOCUMENTS

| | | |
|---|---|---|
| 5,761,615 A | 6/1998 | Jaffee |
| 2005/0143038 A1 | 6/2005 | Lafleur |
| 2009/0156135 A1* | 6/2009 | Kamizuma .......... H04B 1/0082 455/73 |

FOREIGN PATENT DOCUMENTS

JP         5970425 B2      7/2016

* cited by examiner

*Primary Examiner* — Phuong Phu
(74) *Attorney, Agent, or Firm* — Knobbe, Martens, Olson & Bear, LLP (57) ABSTRACT

Aspects of this disclosure relate to a very low intermediate frequency (VLIF) receiver with multi-decade contiguous radio frequency (RF) band coverage. Non-quadrature local oscillator (LO) signals drive mixers. The non-quadrature signals can be generated from low noise digital dividers having non-traditional division ratios. The non-traditional division ratios can be prime number ratios such as 5 and 7. The systematic non-quadrature nature of the LO/mixer can be subsequently corrected by a deterministic I-Q coupling network prior to complex signal processing.

17 Claims, 8 Drawing Sheets

NON-QUADRATURE LOCAL OSCILLATOR MIXING AND MULTI-DECADE COVERAGE

CROSS-REFERENCE TO RELATED APPLICATIONS

The present application claims priority to U.S. Provisional Patent Application No. 62/722,448, filed Aug. 24, 2018, and titled "NON-QUADRATURE LOCAL OSCILLATOR MIXING AND MULTI-DECADE COVERAGE," the entirety of which is hereby incorporated herein by reference.

FIELD OF DISCLOSURE

The disclosed technology relates to receivers and transceivers.

BACKGROUND

Wireless radio transmits and receives over a broad range of channel frequencies. The radio frequency (RF) operating bands that are used for different applications can be subject to local regulations and can differ from country to country. Wireless metering is an example of an application of medium and long range communications that is not defined globally. Europe may specify that communications to a wireless meter occur in and around 800 MHz and 860 MHz; the U.S. may specific that the communications use between 902 MHz and 928 MHz, and 470 MHz, and China may specify a 500 MHz to 700 MHz frequency band for wireless metering communications. The design of the local oscillator is important The ability of receivers, transmitters, and transceivers to cover a wide range of frequency bands is based on the design of the local oscillator.

SUMMARY OF THE DISCLOSURE

The innovations described in the claims each have several aspects, no single one of which is solely responsible for the desirable attributes. Without limiting the scope of the claims, some prominent features of this disclosure will now be briefly described.

One aspect of this disclosure is a wireless device having nonquadrature local oscillator mixing and continuous bandwidth coverage. The wireless device comprises a local oscillator circuit including a voltage controlled oscillator circuit and a divider circuit in communication with an output of the voltage controller oscillator circuit. The divider circuit is selectable between an integer division factors in a range from 4 to 7 and the local oscillator is configured to generate first and second carrier signals. The wireless device further comprises first and second mixer circuits configured to mix a radio frequency signal with the first and second carrier signals to generate first and second mixed signals, respectively, and an image correction circuit configured to apply a correction factor to the first and second mixed signals to correct static phase and amplitude offset errors in response to the divider circuit being configured with the integer division factor in the range being an odd number.

The local oscillator circuit can provide continuous octave bandwidth tuning. The local oscillator circuit can further comprise a divide-by 2 tree circuit configured to receive an output of the divider circuit. The local oscillator circuit can provide multi-decade bandwidth tuning. The wireless device can further comprise an antenna configured to transmit and receive radio frequency signals. The first and second carrier signals can be nonquadrature signals when the divider circuit is configured as the one of a divide-by-5 divider and a divide-by-7 divider. The static offset errors can be phase and amplitude errors caused by the nonquadrature signals.

The image correction circuit can include a first static offset circuit and a second static offset circuit. Each of the first and second static offset circuits can be selectable between a first configuration that is selected in response to the divider circuit being configured as a divide-by-5 divider, a second configuration that is selected in response to the divider circuit being configured as a divide-by-7 divider, and a third configuration that is selected in response to the divider circuit being configured as one of a divide-by-4 divider and a divide-by-6 divider. The image correction circuit can further include a first residual offset circuit and a second residual offset circuit. The first and second residual offset circuits can include R-2R resistor stages that are configured to correct residual phase and amplitude errors of the first and second mixed signals. The voltage controlled oscillator circuit can comprise only one voltage controlled oscillator.

Another aspect of this disclosure is a method to provide a wireless device with continuous bandwidth coverage. The method comprises selecting an integer division factor in a range from 4 to 7 in a divisor circuit of a local oscillator circuit, generating first and second local oscillator carrier signals with the local oscillator circuit, mixing, with a mixer circuit, the first and second local oscillator carrier signals with a radio frequency signal to generate I and Q signals, and correcting the image attenuation of the I and Q signals by applying the I and Q signals to an image correction circuit and selecting a first configuration of the image correction circuit in response to the divider circuit including the selected integer division factor.

The method can further comprise selecting a tap of a divide-by-2 tree of the local oscillator circuit, an input of the divide-by-2 tree in communication with an output of the divider circuit. The first and second local oscillator carrier signals can be nonquadrature signals when the divider circuit includes one of a divide-by-5 divider and a divide-by-7 divider, and the image correction circuit can be configured to reduce the image attenuation generated by the nonquadrature signals. The method can further comprise applying the I signal to a first residual offset correction circuit of the image correction circuit and applying the Q signal to a second residual offset correction circuit of the image correction circuit.

One aspect of this disclosure is a wireless device having nonquadrature local oscillator mixing and continuous bandwidth coverage. The wireless device comprises a local oscillator circuit including a voltage controlled oscillator circuit and a divider circuit in communication with an output of the voltage controller oscillator circuit. The divider circuit is selectable between integer division factors in a range from 4 to 7 and the local oscillator is configured to generate first and second carrier signals. The wireless device further comprises first and second mixer circuits configured to mix a radio frequency signal with the first and second carrier signals to generate I and Q signals, respectively, and an image correction circuit comprising a first selectable static offset correction circuit configured to apply a first static correction factor to the Q signal and a second selectable static offset correction circuit configured to apply a second static correction factor to the I signal.

The image correction circuit can further comprise a first residual offset correction circuit configured to apply a first residual correction factor to the Q signal and a second residual offset correction circuit configured to apply a second residual correction factor to the I signal in response to the divider circuit comprising one of a divide-by-5 divider and a divide-by-7 divider. The image correction circuit can further comprise a summing circuit configured to sum outputs of the first and second selectable static correction circuits, outputs of the first and second residual correction circuits, and the Q signal. The image correction circuit can further comprise a first input resistor in series with a path of the Q signal and a second input resistor in series with a path of the I signal.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments and are not intended to be limiting.

DETAILED DESCRIPTION

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

There are many regulations in wireless radio that control the transmission and reception parameters of radio frequency (RF) signals within frequency bands. Some RF operating bands are defined globally, but other RF operating bands can differ from country to country for similar applications and can be subject to local regulations. Radio products developed for use in one country may not be able to use the same frequency plan in other regions of the world. The design of the local oscillator (LO) is important for radios that can operate over a wide band of frequencies.

The local oscillator output is a signal that is generated by the radio for the purposes of frequency translation of information carrying signals. In a transmitter, the information that is to be sent is modulated around a carrier signal that is based on the signal from the local oscillator. In a receiver, the incoming signal is demodulated by mixing it with a lower frequency signal based on the signal from the local oscillator to extract the information. The local oscillator can generate two output signals that are 90 degrees or approximately 90 degrees apart in phase that can be used in the modulation and demodulation of the radio signals. Ideally the I and Q local oscillator signals are sinusoidal signals which are 90 offset from one another in terms of phase.

Digital circuit design works with square waves. The I and Q local oscillator signals can be square waves which are offset by 25% or approximately 25% of the period of the square wave. An LC oscillator core can be followed by a digital frequency divider to provide the I and Q local oscillator signals. For example, an LC oscillator core followed by a digital high speed, digital frequency divide-by-2 which can be a master and a slave latch forming a flip-flop. The outputs of the master latch and the slave latch can form 90 degrees phase shifted signals that are at half or approximately half of the frequency of the LC oscillator. Digital frequency dividers can generate quarter cycle offsets when the divider values are powers of 2. For example, divide-by-4, divide-by-8, divide-by-16 can generate 25% cycle offset output signals.

Further, when the input signal to the divide-by-2 tree has a 50% duty cycle (e.g., a 50/50 mark/space ratio), other division factors, such as a divide-by-3 can be generated with 3 half waveforms by exploiting positive and negative edges of the input clock waveform. Quadrature local oscillator signals can be generated for divisors that are two times an even or an odd integer, such as 6 (2 time 3), 10 (2 times 5) etc. Further, when a divider exploiting both the positive and negative edges of the input clock waveform is used to generate a 50% duty cycle waveform, it can be subsequently followed by a divide-by-2 circuit to generate quadrature signals. A divide-by-3 can output a 50% duty cycle waveform (high for 3 half cycles of the input clock, and low for the subsequent 3 half cycles), and when followed by a master-slave based divide-by-2 circuit, quadrature outputs corresponding to an overall divide-by-6 circuit can be produced. Similarly, quadrature outputs can be produced by a divide-by-5 with 50% duty cycle output followed by a divide-by-2, corresponding to an overall divide-by-10 circuit. However, this is extremely difficult for prime numbers, such as 5 and 7.

Instead of having a single oscillator, a radio can have a plurality of oscillators that can be arranged so that the tuning ranges can overlap. By selecting the appropriate oscillator, the radio can cover a more continuous wider band of RF spectrum for receiving or transmitting. However, oscillators can use inductors as part of an LC tank circuit for generating the oscillating signal. The inductors can be physically large. When more than one inductor is being integrated with a single integrated circuit, they can be spaced apart so as not to magnetically couple with one another and cause energy losses that degrade the performance of the operating oscillator. The multiple oscillator approach can occupy are larger area, which increases costs, than a single oscillator approach.

High performance wide band receivers can tune the local oscillators over a continuous octave range by designing the LC tank with very small inductance values and high capacitance values. Fixed and parasitic capacitances become a smaller fraction of the total capacitance in the LC tank to obtain the wide tuning range. However, the impedance of the LC tank, which is has a maximum value given by $Q_L \omega L$ (where $Q_L$ is the quality factor of the inductor), becomes very small and the power consumption of the local oscillator can become very, very high. Once an octave-range oscillator has been achieved (it may tune over an additionally broader range to compensate for manufacturing tolerances), then it can be followed by a power-of 2 type divider tree to achieve multi-decade band coverage.

Aspects described herein are directed to low power, low cost receivers, transmitter, and transceivers that include a single local oscillator circuit that can reconfigure its operating bands with a software command or a programmable parameter to cover a continuous wide range of frequencies. In an aspect, a non-quadrature local oscillator generation can be used to generate the continuous octave BW coverage. Local oscillators have a single voltage controlled oscillator and modest bandwidth (BW) tuning and use a divide-by-2 tree to obtain multi-decade BW coverage from the octave BW coverage. An input resistor and image correction network at baseband can correct for the non-quadrature signals. Advantageously, these receivers, transmitter, and transceivers can operate in different regions around the world without specific radios for specific regions.

Figure 1:
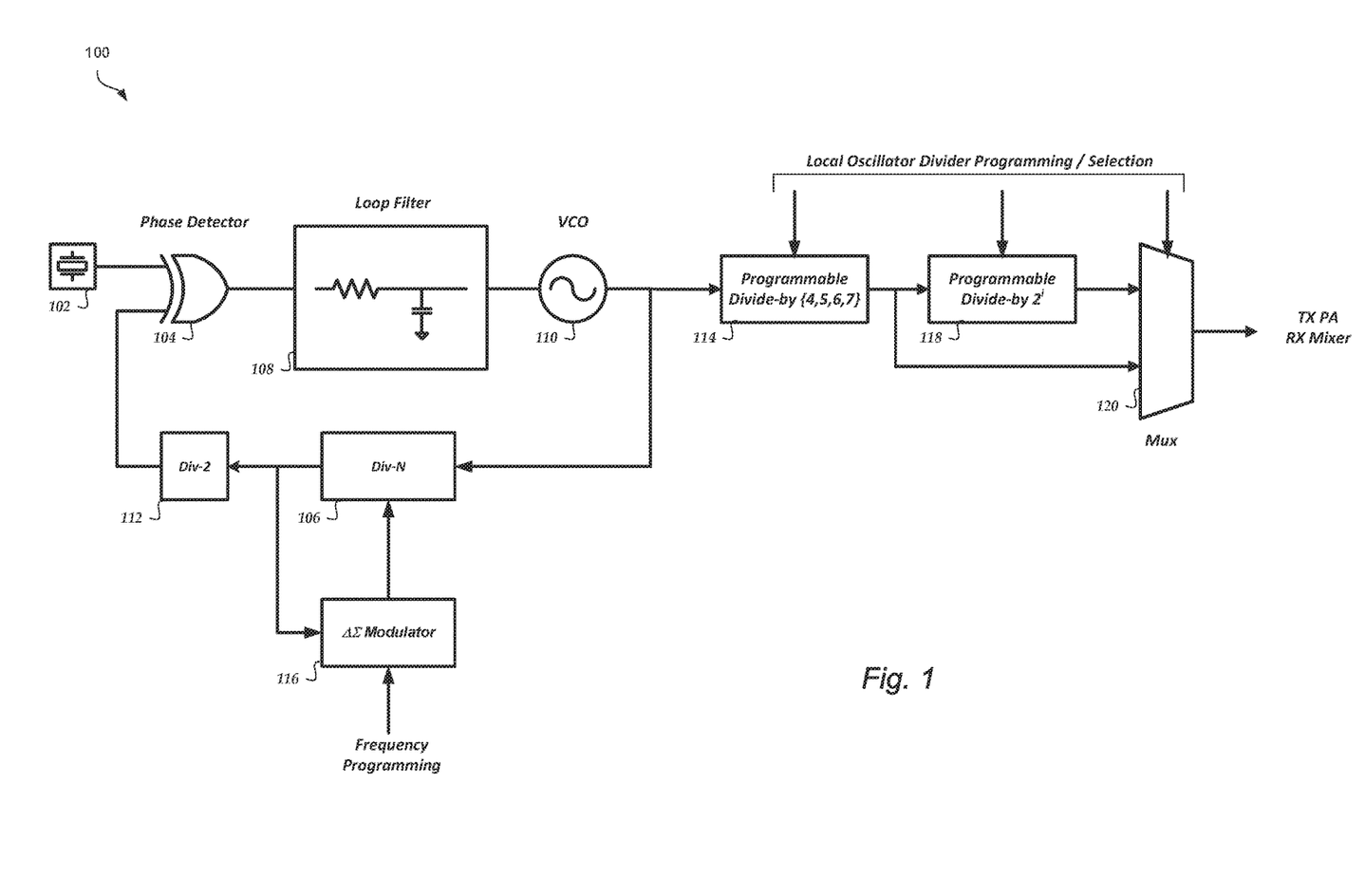
FIG. 1 is a system diagram of a phase-locked loop (PLL) that includes a programmable divide-by-N circuit and a divide-by-two tree according to an embodiment.

FIG. 1 is a system block diagram of a local oscillator (LO) 100 according to an embodiment. The illustrated LO 100 includes an oscillator 102, and a phase-locked loop (PLL) that includes a phase detector 104, a divide-by N circuit 106, a loop filter 108, a voltage controlled oscillator (VCO) 110, a divide-by-2 circuit 112, a programmable divide-by {4, 5, 6, 7} divider circuit 114, a delta sigma modulator 116, a programmable divide-by-two divider tree circuit 118, and a multiplexer 120.

The oscillator 102 can generate a clock signal which may be divided or multiplied to provide a reference clock signal to the phase detector 104. The phase detector 104 can detect whether a feedback signal is leading or lagging the reference clock signal. The PLL can be an exclusive or (XOR) PLL, and the phase detector 104 can have XOR functionality. The phase detector 104 can output a phase error information signal to the loop filter 108.

The loop filter 108 can receive the phase information signal from the phase detector 104. The loop filter 108 can output a voltage suitable for driving the VCO 110.

The VCO 110 can output a clock signal having a frequency that is related to the driving voltage from the loop filter 108. The clock signal can be fed back into the divide-by N circuit 106 and the divide-by 2 circuit 112 to divide the frequency of the clock signal back down to the frequency of the reference clock signal. A feedback signal from the series of divider circuits 106, 112 can be fed back into the phase detector 104 to complete the PLL loop.

The delta sigma modulator 116 can be in communication with the feedback loop. The delta sigma modulator 116 can be configured as an additional feedback loop with the divide-by-N divider 106 to allow the PLL to operate as a delta-sigma based fractional-N frequency synthesizer. In some aspects, the delta sigma modulator 116 can be a delta sigma MASH modulator. In other embodiments, other types of modulators can be used.

The clock signal from the VCO 110 can be output to the programmable divide-by {4, 5, 6, 7} divider circuit 114. The output of the programmable divide-by {4, 5, 6, 7} divider circuit 114 can be provided to the multiplexer 120 and to the programmable divide-by-2 divider tree circuit 118. The output of the programmable divide-by-2 divider tree circuit 118 can also be provided to the multiplexer 120. The programmable divide-by {4, 5, 6, 7} divider circuit 114, the programmable divide-by 2 divider tree circuit 118 and the multiplexer 120 receive local oscillator divider programming/selection control signals to control the programmable dividers 114, 118 and select the output of the multiplexer 120. The multiplexer 120 can provide the selected clock signal to the mixer in the receiver for demodulation of the receive signal or the power amplifier in the transmitter for modulation of the transmit signal.

The programmable divide-by {4, 5, 6, 7} divider circuit 114 can be programmed to divide by 4, 5, 6, and 7 to generate greater than octave bandwidth (BW) continuous coverage with a single VCO 110. For some divisors, such as 5 and 7, this creates a non-quadrature relationship between the I and Q signals of the receiver. To correct the non-quadrature relationship, the receiver includes an input resistor and image correction network, which is described in more detail below. The divide-by 2 divider tree circuit 118 can be a tree of frequency dividers comprising a series of divide-by 2 divider circuits.

Following the programmable divide-by {4, 5, 6, 7} divider circuit 114 with the divide-by-2 divider tree circuit 118 provides multi-decade BW coverage. When the divide-by {4, 5, 6, 7} divider circuit 114 is followed by the divide-by-2 divider tree circuit 118, the PLL can tap off anywhere along the divide-by-2 chain to generate approximately any frequency. When a range of 2 is covered within the PLL, the receiver can tune continuously or approximately continuously over that range, and then by dividing it by 2, 4, 8, etc., the receiver can tune to any frequency lower than the VCO frequency divided by 2. In an aspect, the PLL can be configured to tune over the approximately minimal range, for example, just barely more than required for a VCO to be manufactured to synthesize a single frequency, and the open loop divider system including the programmable divide-by {4, 5, 6, 7} divider circuit 114, and the programmable divide-by 2 divider circuit 118 can yield the contiguous multi-decade band coverage.

VCO Process Tolerance Budget-Simple Model for a Quick Estimate

The design of an LC oscillator can take into account process variations of the inductor and the capacitor. Assuming inductance variation is $3\sigma$ of ±6% and the tank capacitance is $3\sigma$ of ±20%, then:

$$\mu := 1$$

$$\sigma_L := \frac{0.06}{3}$$

$$\sigma_C := \frac{0.2}{3}$$

$$n := 10000$$

$$L_{norm} := rnorm(n, \mu, \sigma_L)$$

$$C_{norm} := rnorm(n, \mu, \sigma_C)$$

$$\omega := \frac{1}{\sqrt{L_{norm} C_{norm}}}$$

$$\sigma_\omega := stdev(\omega) \quad \sigma_\omega = 0.036$$

$$\rho := 1 \cdot \left(\frac{1 + 3 \cdot \sigma_\omega}{1 - 3 \cdot \sigma_\omega}\right) \rho = 1.239$$

where:
μ is the mean value;
$\sigma_L$ is the standard deviation of the value of the inductor;
$\sigma_c$ is the standard deviation of the value of the capacitor;
n is the sample size;
$L_{norm}$ is the normalized value of the inductor;
$C_{norm}$ is the normalized value of the capacitor;
rnorm(n, μ, σ) is a function which returns a vector of n random numbers having the normal distribution with properties μ and σ;
ω is the normalized resonant frequency of the LC circuit;
stddev(ω) is a function returning the standard deviation of samples ω
$\sigma_\omega$ is the standard deviation of the VCO frequency; and
ρ is the tuning ratio for a single target frequency.

Thus, for a VCO frequency standard deviation of approximately 3.6%, a local oscillator tuning ratio of approximately 1.24:1 can be used to obtain a single target frequency. In other words, for a VCO design to provide a single defined frequency, taking into account the variation in the values of the inductor and capacitor, the tuning ratio for the oscillator to obtain the single frequency is 1.24:1. In manufacturing, some local oscillators will be low and will need to be tuned up in frequency and others will be high and will need to be tuned down in frequency.

Local Oscillator Options for Continuous Band Coverage

The tuning ratio n can be defined as the ratio of the maximum frequency fmax to the minimum frequency fmin that the VCO can be tuned to.

$$n = \frac{f_{max}}{f_{min}}$$

For continuous band coverage, a LO divider system includes a LC oscillator followed by a divider tree that can have programmable or selectable divider ratios. Let the LO divider system include a divide-by-a divider and a divide-by-b divider, where b>a. To tune the VCO between fmax and fmin, To obtain continuous frequency band coverage selecting between the output of a divide-by-a and divide-by-b circuit, then $$\frac{f_{min}}{a} \le \frac{f_{max}}{b} \Rightarrow n \ge \frac{b}{a}$$

For octave coverage in a system with minimum division factor of p and maximum division factor q, then:

$$\frac{f_{max}}{p} \bigg/ \frac{f_{min}}{q} \ge 2 \Rightarrow \frac{q}{p} \ge \frac{2}{n}$$

where a, b, p, q are integers.

Tabulate Some Practical Options for Consideration:

Consider a in the range 4 . . . 7 and b=a+1. Adjacent numbers for a and b provide the greatest frequency overlap. If a and b are not adjacent numbers, then there can be gaps in the continuous BW coverage of the local oscillator. Values of a, b, and b/a for a=4-7 and b=5-8 are tabulated in Table 1.

TABLE 1

| a | b | b/a |
|---|---|-----|
| 4 | 5 | 1.250 |
| 5 | 6 | 1.200 |
| 6 | 7 | 1.167 |
| 7 | 8 | 1.143 |

For the budgeted VCO process variation, for a single target frequency, n=1.24. Allowing the tuning ratio to be slightly wider, ≥1.25:1, then a can be minimized to $a_{min}$=4. For a VCO tuning ratio of n≥1.25 or 22.2% and permitting LO division factors of $2^{i}*\{4,5,6,7\}$ where i=0, 1, 2, . . . , then the VCO can have continuous band coverage for all frequencies below $f_{vco,max}/4$. The design can also implement $f_{vco}/2$ quadrature paths.

Set p=$a_{min}$ for the proposed divider system to achieve octave coverage at the divider system output.

Now find the minimum value of q to satisfy q/p≥2/n≥2/1.25≥1.613. Values of q, q/p for p=4 are tabulated in Table 2.

TABLE 2

| p | q | q/p |
|---|---|-----|
| 4 | 5 | 1.25 |
| 4 | 6 | 1.50 |
| 4 | 7 | 1.75 |
| 4 | 8 | 2.00 |

From Table 2, p=4 and q=7 satisfies q/p≥1.613. For a VCO with a tuning ratio of approximately 1.25:1 and having a set of dividers with divide values of 4, 5, 6, 7, the outputs of the divide system provide frequencies that span an octave. Following the set of 4,5,6,7 dividers with a divide-by-2 divider one can extend band coverage by a further octave. Hence following by a divider that divides by a power of 2, the VCO can provide frequencies that can span one or more decades.

Quadrature Considerations

As described above, LO quadrature signals can be generated for division factors of 4 and 6. However, with standard digital divider techniques, it is not possible to generate quadrature signals for division factors of 5 and 7.

Divide-by 5/7 Non Quadrature I/Q LO Signals

The VCO can generate quasi-quadrature LO signals with a predetermined phase error with respect to 90 degrees.

Figure 2:
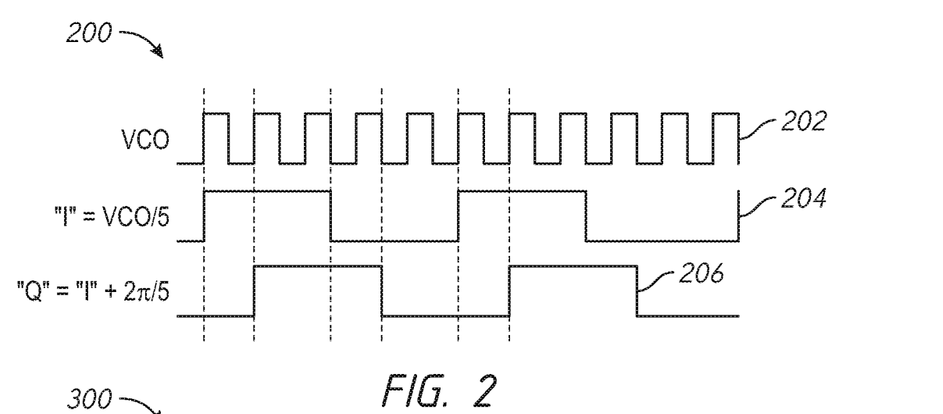
FIG. 2 is a timing diagram illustrating divide-by-5 in-phase (I) and quadrature (Q) waveforms according to an embodiment.

FIG. 2 is a timing diagram 200 illustrating a VCO waveform 202, a divide-by-5 in-phase (I) waveform 204, and a divide-by-5 quadrature (Q) waveform 206 according to an embodiment. In illustrated divide-by-5 in-phase (I) waveform 204, 5 VCO waveform half cycles form a first half cycle of the divide-by-5 in-phase (I) waveform 204 and 5 VCO waveform half cycles form a second half cycle of the divide-by-5 in-phase (I) waveform 204. The divide-by-5 quadrature waveform 206 is shifted from the divide-by-5 in-phase (I) waveform 204 by one-fifth of a cycle.

The phase difference between the divide-by-5 in-phase (I) waveform 204 and the divide-by-5 quadrature (Q) waveform 206 is $\theta_{IQ}=72°$, instead 90 degrees or approximately 90 degrees. The phase error is $\theta_{err}=-18°$.

Figure 3:
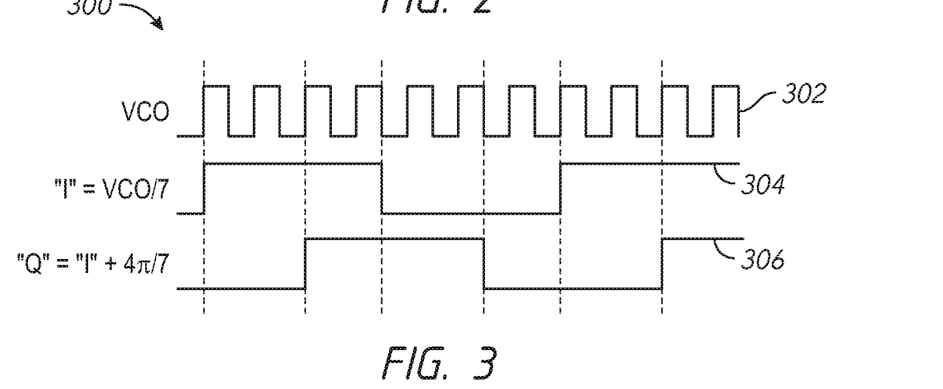
FIG. 3 is a timing diagram illustrating divide-by-7 in-phase (I) and quadrature (Q) waveforms according to an embodiment.

FIG. 3 is a timing diagram 300 illustrating a VCO waveform 302, a divide-by-7 in-phase (I) waveform 304, and a divide-by-7 quadrature (Q) waveform 306 according to an embodiment. In illustrated divide-by-7 in-phase (I) waveform 304, 7 VCO waveform half cycles form a first half cycle of the divide-by-7 in-phase (I) waveform 304 and 7 VCO waveform half cycles form a second half cycle of the divide-by-7 in-phase (I) waveform 304. The divide-by-7 quadrature waveform 306 is shifted from the divide-by-7 in-phase (I) waveform 304 by two-sevenths of a cycle.

The phase difference between the divide-by-7 in-phase (I) waveform 304 and the divide-by-7 quadrature (Q) waveform 306 is $\theta_{IQ}=102.875°$, instead 90 degrees or approximately 90 degrees. The phase error is $\theta_{err}=+12.857°$.

Image Attenuation and Amplitude/Phase Errors

The consequence of not having quadrature LO signals can be degraded image attenuation. When the I and Q signals are not in quadrature, the modulation or demodulation process can cause some of the information on the I signal to transfer to the Q signal and some of the information on the Q signal to transfer to the I signal. This cross-contamination, for example, can degrade the ability of a receiver to receive a signal with a high degree of fidelity.

The I and Q signals can be represented as:

$$I = \cos(\omega_{IF}t + \varphi(t))$$
$$Q = -10^{\delta/20}\sin\left(\omega_{IF}t + \varphi(t) - \varepsilon\frac{\pi}{180}\right)$$

where:

δ is the amplitude error in dB; and

ε is the phase error in degrees.

The image attenuation IR is an expression of the cross-contamination in dBs. The image attenuation can be given by:

$$IR_{dB}(\delta, \varepsilon) := 10 \cdot \log\left[\frac{1 + 2 \cdot \left(\frac{\delta}{10^{20}}\right) \cdot \cos\left(\varepsilon \cdot \frac{\pi}{180}\right) + \left(\frac{\delta}{10^{20}}\right)^2}{1 - 2 \cdot \left(\frac{\delta}{10^{20}}\right) \cdot \cos\left(\varepsilon \cdot \frac{\pi}{180}\right) + \left(\frac{\delta}{10^{20}}\right)^2}\right]$$

Image Correction Coefficients

Figure 4:
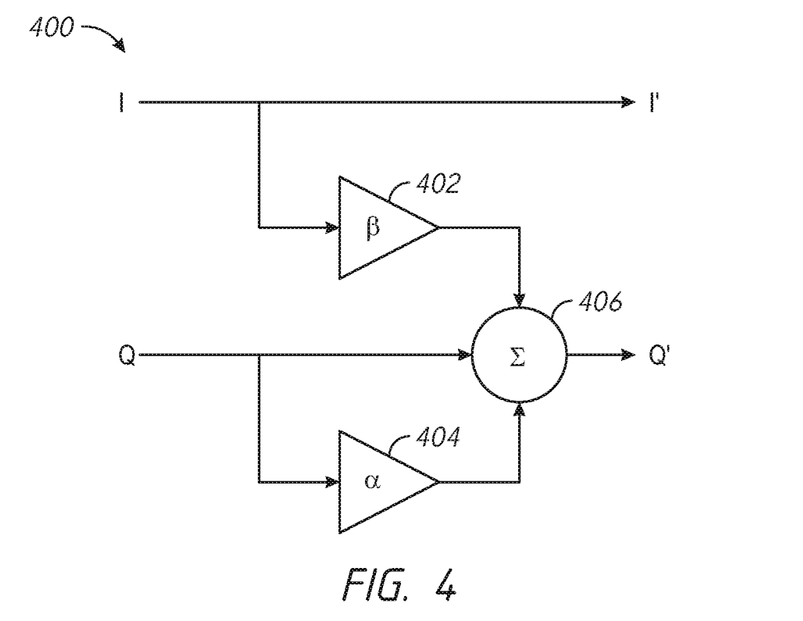
FIG. 4 is a block diagram illustrating image correction according to an embodiment.

FIG. 4 is a block diagram illustrating image correction 400 according to an embodiment. The illustrated image correction block 400 outputs signals I' and Q' and includes a first scaling circuit 402 having a correction coefficient of β, a second scaling circuit 404 having a correction coefficient of α, and a summing circuit 406. The image correction block 400 can scale the I signal by α, scale the Q signal by β, and sum the scaled I signal, the scaled Q signal and the Q signal to produce the Q' signal. The I signal becomes the I' signal. The correction factor α and β can correct for amplitude and phase errors mathematically.

The correction factors are defined by:

$$\alpha(\delta, e) := \frac{1}{\left(\frac{\delta}{10^{20}}\right) \cdot \cos\left(\varepsilon \cdot \frac{\pi}{180}\right)} - 1$$

$$\beta(\varepsilon) := \tan\left(\varepsilon \cdot \frac{\pi}{180}\right)$$

The first correction factor α is a function of the amplitude error δ in dB and the phase error ε in degrees. The second correction factor β is a function of the phase error ε in degrees.

Plots of IR Correction Coefficients Versus Phase Error & Amplitude Error

Figure 5:
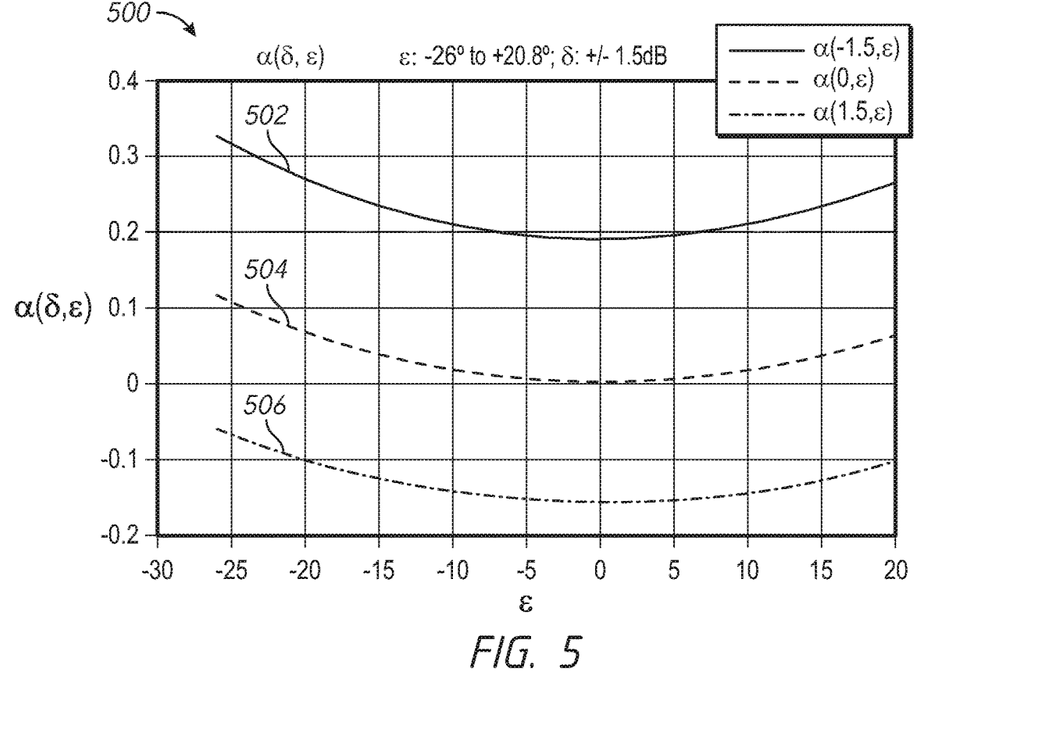
FIG. 5 shows plots of a first image attenuation correction coefficient as a function of phase error and amplitude error.

FIG. 5 is a graph 500 of plots of the first correction factor as a function of amplitude and phase error. The graph 500 illustrates values of α for about −1.5 to about +1.5 dB amplitude error ranges and about −26° to about +20.8° phase error ranges. Plot 502 shows values of α for a −1.5 dB amplitude error δ swept over a phase error ε range of about −26° to about +20.8°. Plot 504 shows values of α for a 0 dB amplitude error δ swept over the phase error ε range of about −26° to about +20.8°. Plot 506 shows values of α for a +1.5 dB amplitude error δ swept over the phase error ε range of about −26° to about +20.8°.

Figure 6:
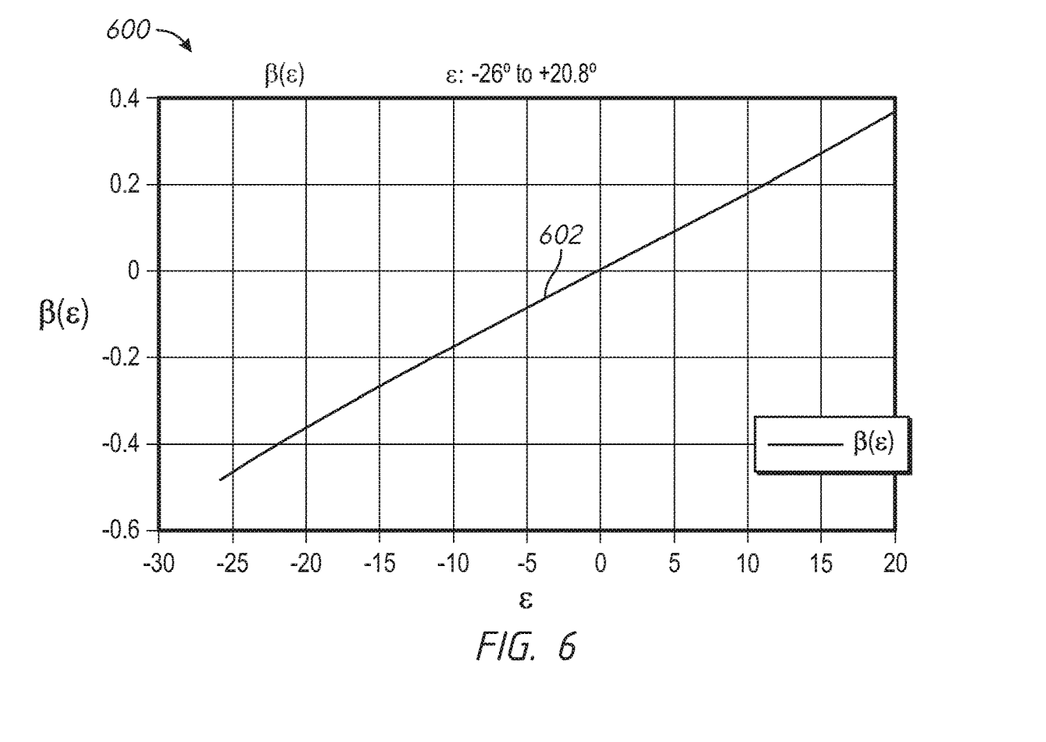
FIG. 6 shows plots of a second image attenuation correction coefficient as a function of phase error.

FIG. 6 a graph 600 of a plot 602 of the second correction factor β as a function of the phase error. Plot 602 shows values of β for a phase error range of about −26° to about +20.8°.

Offset in α, β for ε=Π/5-Π/2 and 2Π/7-Π/2

Consider residual phase offset for the divide-by-5 divisor and the divide-by-7 divisor. Table 3 tabulates the correction factors α and β and the approximate correction factors for α and β for the divide-by-5 divisor and the divide-by-7 divisor phase errors ε. The amplitude error δ is set to zero.

TABLE 3

| Coefficient | ε | α | β | α approx. | β approx. | ε residual | δ residual |
|---|---|---|---|---|---|---|---|
| Div 5 | −18° | 0.0515 | 0.3249 | 1/20 | 3/9 | −0.435° | +0.12 dB |
| Div 7 | +12.857° | 0.0257 | 0.2282 | 1/40 | 2/9 | 0.328° | −0.015 dB |

In the illustrated example, simple ratiometric fractions are chosen, as indicated by α approx. and β approx. for implementing a static error correction for α and β. These values are suitable for resistor string ratios and can be conveniently implemented. In other aspects, lower residual phase error can be attainable with other fractions which may also be suitable for practical implementation. In other aspects, the implementation of the correction factors can implement other degrees of precision.

The residual phase error, ε residual, and the residual amplitude error, δ residual, illustrate remaining imperfections in the quadrature correction. However, these residual errors are very small when compared to the initial phase and amplitude error in the quasi-quadrature LO signals. Further, the correction factors have reduced the residual errors to a range that can be typical in an uncorrected receiver, such as one using a divider that easily creates the I and Q LO signals.

Figure 7:
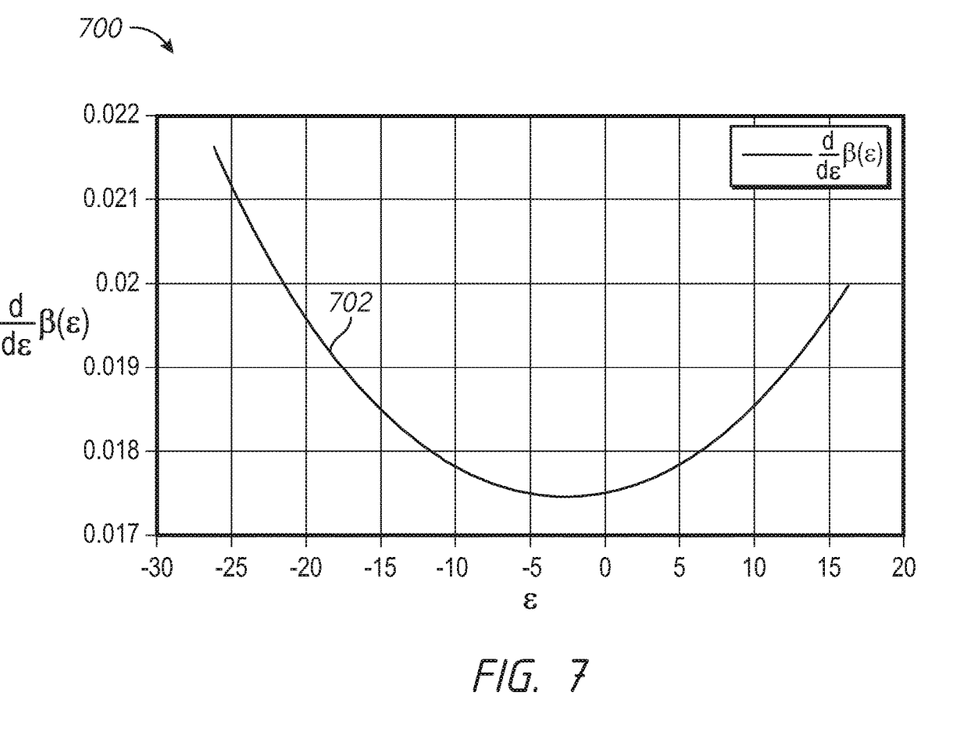
FIG. 7 shows a plot of the derivative of the second image attenuation correction coefficient relative to the phase error as a function of the phase error.

FIG. 7 is a graph 700 illustrating a plot 702 of the derivative of the second correction factor $\beta$ relative to the phase error $\varepsilon$ as a function of the phase error $\varepsilon$. Plot 702 illustrates that the derivative is not strongly dependent on the phase error $\varepsilon$.

Figure 8:
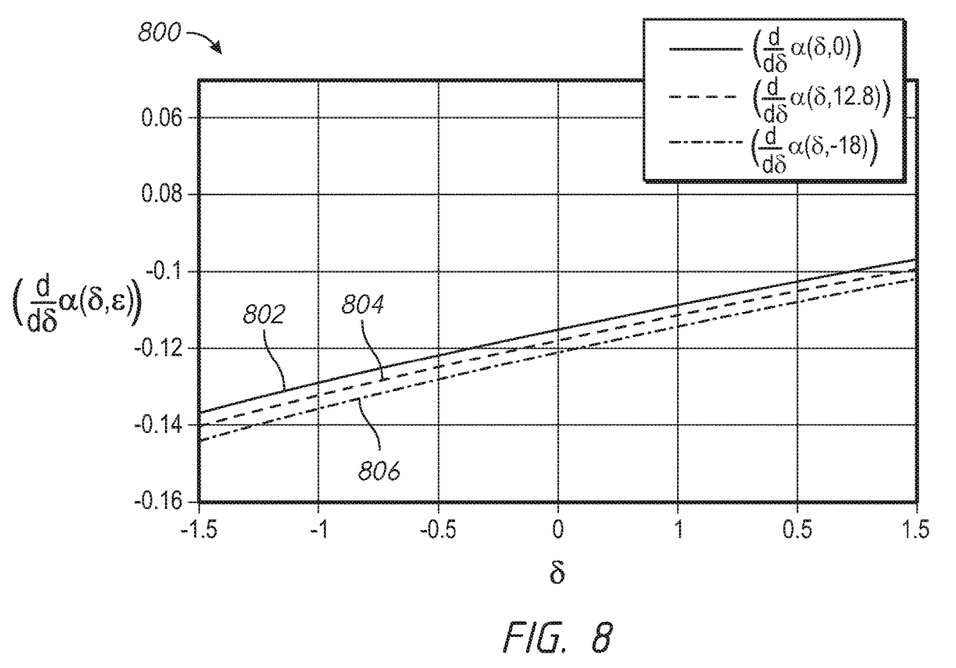
FIG. 8 shows plots of partial derivatives of the first image attenuation correction coefficient relative to the amplitude error as a function of the amplitude error.

FIG. 8 is a graph 800 illustrating plots of partial derivatives of the correction factor $\alpha$ relative to the amplitude error $\delta$ as a function of the amplitude error $\delta$. FIG. 8 illustrates that the partial derivative with respect to the amplitude error $\delta$ is not strongly dependent on the phase error $\varepsilon$. Plot 802 shows values of the partial derivative of $\alpha$ for a −18 degree phase error swept over an amplitude error $\delta$ range of about −1.5 dB to about +1.5 dB. Plot 804 shows values of the partial derivative of $\alpha$ for a 12.8 degree phase error swept over the amplitude error $\delta$ range of about −1.5 dB to about +1.5 dB. Plot 806 shows values of the partial derivative of $\alpha$ for a 0 degree phase error swept over the amplitude error $\delta$ range of about −1.5 dB to about +1.5 dB.

Figure 9:
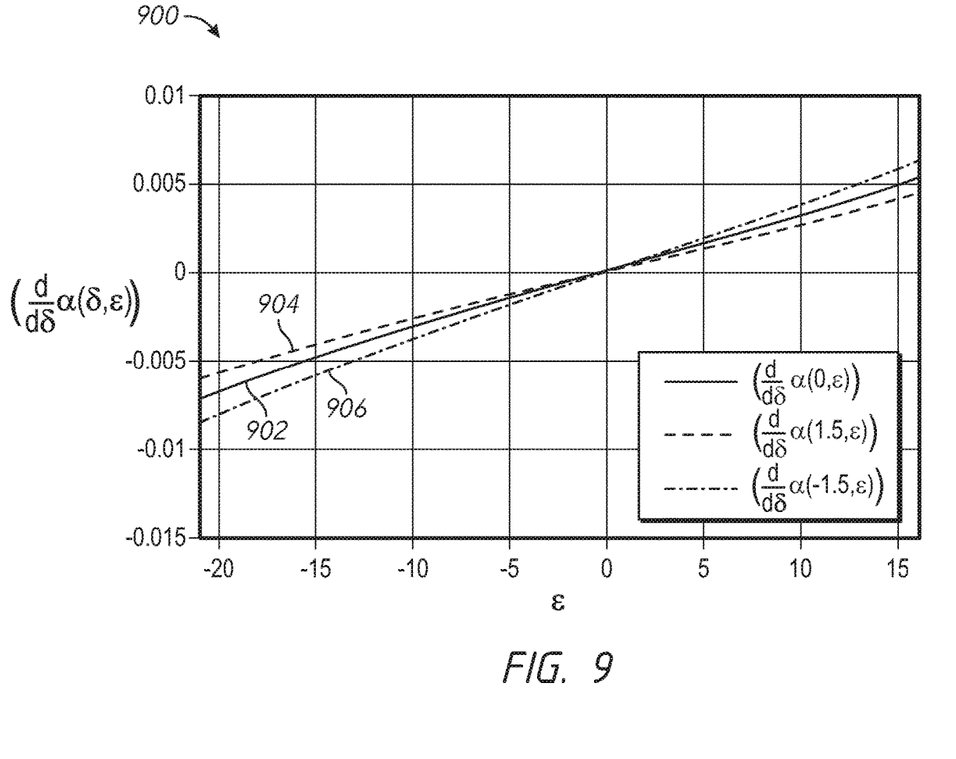
FIG. 9 shows plots of partial derivatives of the first image attenuation correction coefficient relative to the amplitude error as a function of the phase error.

FIG. 9 is a graph 900 illustrating plots of partial derivatives of the first correction factor $\alpha$ relative to the phase error $\varepsilon$ as a function of the phase error $\varepsilon$. FIG. 9 illustrates that the partial derivative with respect to the phase error c is sensitive to the phase error $\varepsilon$. Plot 902 shows values of the partial derivative of $\alpha$ for a 0 dB amplitude error $\delta$ swept over the phase error $\varepsilon$ range of about −19° to about +16°. Plot 904 shows values of the partial derivative of $\alpha$ for a 1.5 dB amplitude error $\delta$ swept over the phase error $\varepsilon$ range of about −19° to about +16°. Plot 906 shows values of the partial derivative of $\alpha$ for a −1.5 dB amplitude error $\delta$ swept over the phase error $\varepsilon$ range of about −19° to about +16°. To maintain the error correction resolution, the resistor string implementing the first and second correction factors $\alpha$ and $\beta$ can be augmented with R-2R resistor divider stages.

Receiver Block Diagram

Figure 10:
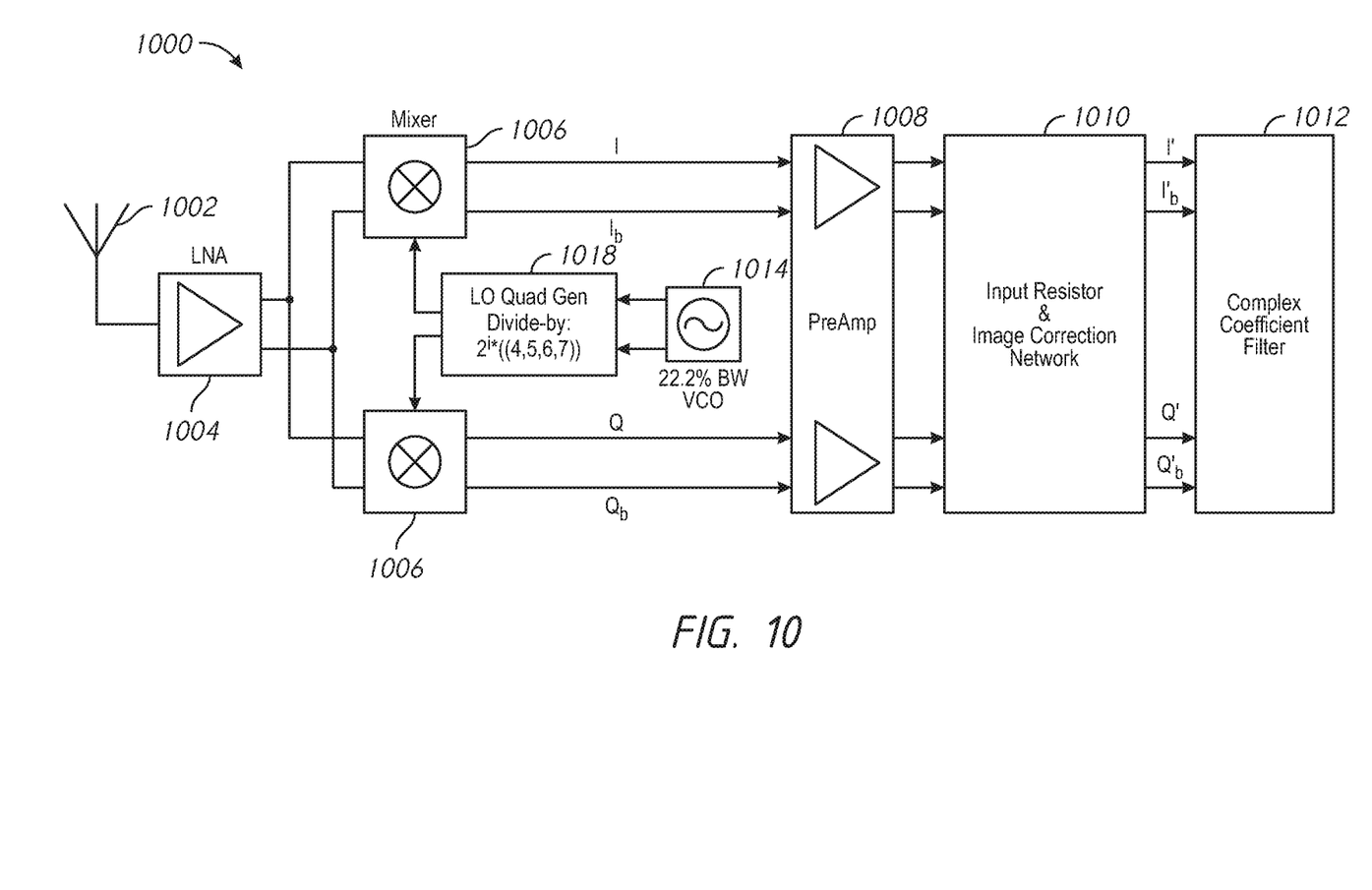
FIG. 10 is a system block diagram of a receiver including a non-quadrature local oscillator generation and image attenuation correction according to an embodiment.

FIG. 10 is a system block diagram of a receiver 1000. The illustrated receiver 1000 includes an antenna 1002, a low noise amplifier (LNA) 1004, mixers 1006, a preamplifier 1008, an input resistor and image correction network 1010, a complex coefficient filter 1012, a VCO 1014, and a LO quadrature or approximately quadrature signal generator 1014 for divide by $2^{i}*(\{4, 5, 6, 7\})$ dividers. Receiver 1000 can be a very low intermediate frequency (VLIF) receiver.

The LNA 1004 can amplify the RF signal received by the antenna 1002. To demodulate the data from the amplified signal, mixers 1006 can down-mix or down-convert the amplified signal 1004 with signals that are approximately 90 degrees apart in phase and are generated by the LO quadrature signal generator 1014. The illustrated mixer 1006 provides differential I and Q signals. For example the upper mixer 1006 can generate I and its inverse I bar (Ib) and the lower mixer 1006 can generate Q and its inverse Q bar (Qb). In other aspects, the mixers 1006 provide single-ended signals I and Q.

The LO quadrature signal generator 1014 receives the clock signal from the VCO 1014. The VCO 1014 has a modest bandwidth, such as the 22.2% bandwidth corresponding to the minimal 1.25:1 tuning ratio discussed above.

The preamplifier 1008 can buffer or amplify the I and Q information signals I, Ib, Q, and Qb. The input resistor and image correction circuit 1010 can correct for the phase error of the non-quadrature LO signals generated by the divide-by-5 and the divide-by-7 dividers of the LO quadrature signal generator 1014. The input resistor and image correction circuit 1010 can generate the quadrature corrected I and Q signals, I', Ib', Q', and Qb'. In some aspects, the input resistor and image correction circuit 1010 can include the input resistor the resistor strings, and the R-2R stages.

The complex coefficient filter 1012 can provide filtering for the quadrature corrected I and Q information signals I', Ib', Q', and Qb' for further baseband processing.

Figure 11:
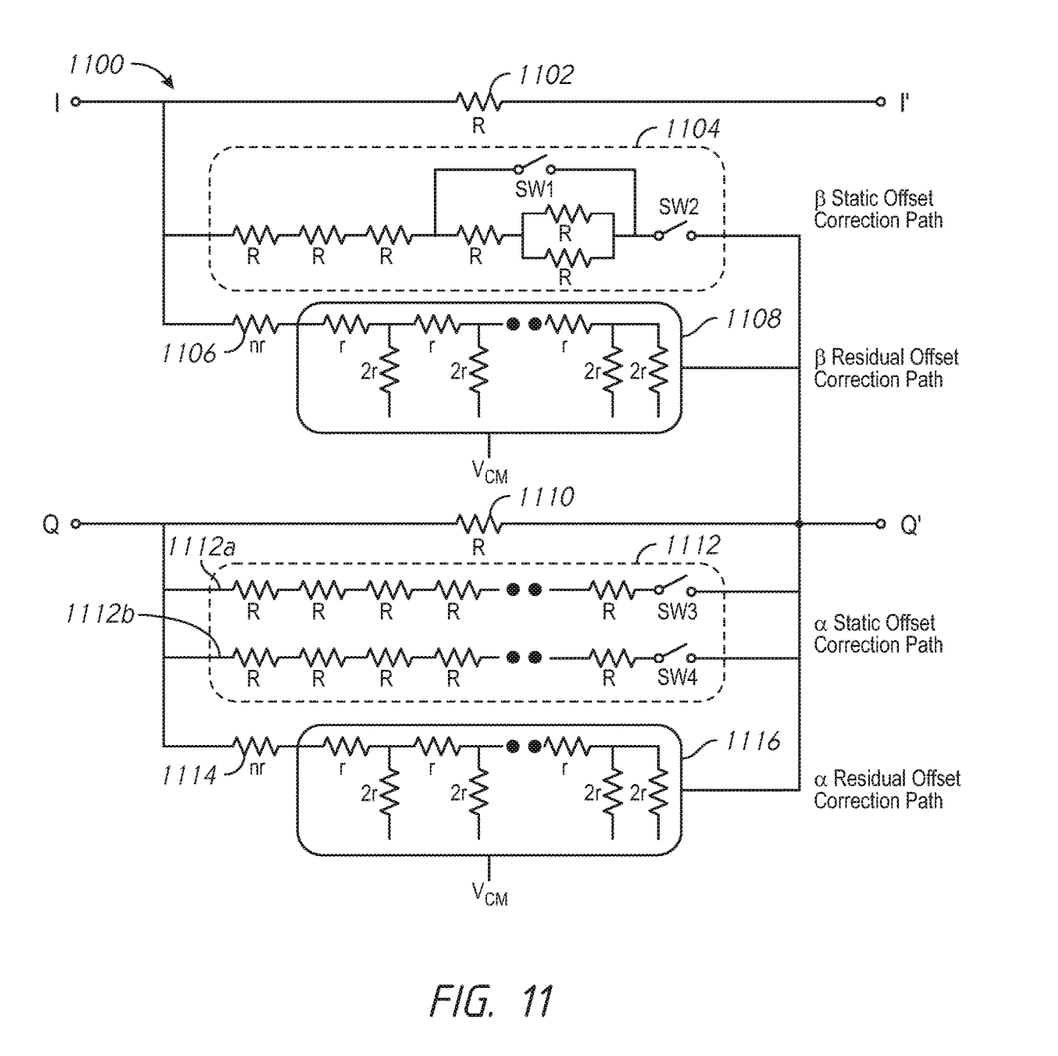
FIG. 11 shows a schematic block diagram of an image attenuation correction circuit according to an embodiment.

FIG. 11 shows a schematic block diagram of an input resistor and image correction circuit 1100 that can be used to correct the amplitude and phase error in the non-quadrature signals generated by the divide-by-5 or the divide-by 7 dividers in the LO 100, according to an embodiment. The illustrated input resistor and image correction circuit 1100 includes main I input resistor R 1102, programmable or selectable resistor strings 1104 to generate the second correction factor $\beta$ in the $\beta$ static offset correction path, an I input resistor nR 1106, R-2R stages 1108 to correct the $\beta$ residual offset in the $\beta$ residual offset correction path, a main Q input resistor R 1110, programmable or selectable resistor strings 1112 to generate the first correction factor $\alpha$ in the $\alpha$ static offset correction path, a Q input resistor nR 1114, R-2R stages 1116 to correct the $\alpha$ residual offset in the $\alpha$ residual offset correction path, and a plurality of switches SW1-SW4. FIG. 11 illustrates a single ended implementation of the image correction circuit 1100. In another aspect, a differential input resistor and image correction circuit can be implemented. A differential implementation can facilitate negative coefficients through cross switching of I/Ib and Q/Qb.

The I input is in communication with a first end of the main I input resistor R 1102 and the second end of the main I input resistor R 1102 is in communication with the I' output. The I input is further in communication with a first end of the resistor strings 1104 and the first end of the I input resistor nR 1106. A second end of the I input resistor nR 1106 is in communication with a first end of the R-2R stage 1108.

The Q input is in communication with a first end of the main Q input resistor R 1110, a first end of the resistor strings 1112, and a first end of the Q input resistor nR 1114. A second end of the Q input resistor nR is in communication with a first end of the R2R stage 1116. The Q' output is in communication with a second end of the resistor strings 1104, a second end of the r-2R stage 1108, a second end of the main Q input resistor R 1110, a second end of the resistor strings 1112, and a second end of the R-2R stage 1116.

Referring to FIGS. 4 and 11, applying I and Q to the I input and the Q input, respectively, the I signal passes through the main I input resistor R 1102 to provide the I' signal and the Q' signal is the sum of the $\beta$ static and residual offset correction paths, the $\alpha$ static and residual offset correction paths, and the Q signal via the main Q input resistor R 1110. I' and Q' can be connected to the virtual ground inputs of the following complex filtering block in the receiver.

In the illustrated input resistor and image correction circuit 1100, switch SW2 can be closed and switch SW1 can be open to provide a 4.5 R series branch for the second correction factor $\beta$ when a divide-by-5 divider is used. Switches SW1 and SW2 can be closed to provide a 3R series branch for the second correction factor $\beta$ when a divide-by-7 divider is used. Switch SW2 can be open when the second correction factor $\beta$ is not used, such as when the divider is not a divide-by-5 or a divide-by-7 divider.

In the illustrated input resistor and image correction circuit 1100, the resistor string 1112a in the $\alpha$ static offset correction path can include 20 resistors R in series to provide the first correction factor α when a divide-by-5 divider is used. The resistor string 1112b in the α static offset correction path can include 40 resistors R in series to provide the first correction factor α when a divide-by-7 divider is used. Switch SW3 can be closed and switch SW4 can be open when the divide-by-5 divider is used. Conversely, Switch SW3 can be open and switch SW4 can be closed when the divide-by-7 divider is used. Both switches SW3 and SW4 can be open when the first correction factor α is not used, such as when the divider is not a divide-by-5 or a divide-by-7 divider.

Configurations of the R-2R stage 1108 in the β residual offset corrections path and the R-2R stage 1116 in the α residual offset corrections path are based on the phase error ε and amplitude error δ of the I and Q signals generated by the LO quadrature generator divide by $2^{i}*(\{4, 5, 6, 7\})$ circuit 1018.

Figure 12:
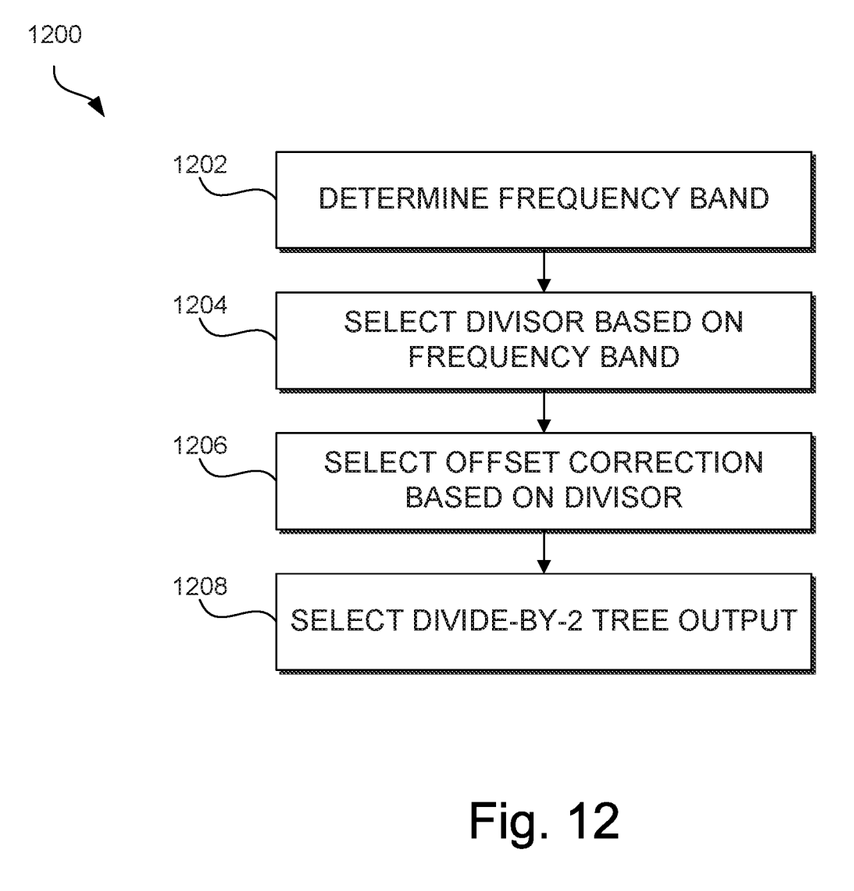
FIG. 12 is a flow chart illustrating a process to customize frequency band tuning for a receiver or transceiver according to an embodiment.

FIG. 12 is a flow chart illustrating a process 1200 to customize frequency band tuning for a receiver, such as the receiver 1000 or a transceiver according to an embodiment.

At block 1202, the user can determine the tunable frequency band, and a block 1202, can selects a divisor based at least in part on the tunable frequency band. In an aspect, the divisors are one or 4, 5, 6, and 7 for implementation if a divide-by-4, divide-by-5, divide-by-6, and divide-by-7 divider 114, respectively.

At block 1206, the user selects the offset correction based at least in part on the divisor. The offset correction can be the configuration of the input resistor and image correction circuit 1100 to provide β static and residual and α static and residual correction factors for the I and Q signals.

At block 1208, the user selects the tap from the divide-by 2 tree 118 to provide the tunable frequency band.

Methods, circuits, and systems to significantly enhance octave and decade continuous bandwidth coverage of receivers and transceiver are disclosed. Improvements to the bandwidth coverage disclosed herein can apply to any receiver and transceiver. Examples of circuits for local oscillators, phase-locked loops, and input resistor and image correction are described.

Any of the principles and advantages discussed herein can be applied to other systems, circuits, and methods, not just to the systems, circuits, and methods described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Some of the embodiments described above have provided examples in connection with receivers. However, any suitable principles and advantages of the embodiments can be applied to transmitters and transceivers as appropriate. More generally, any of the principles and advantages discussed herein can be implemented in connection with any other systems, apparatus, or methods that benefit could from any of the teachings herein. For instance, any of the principles and advantages discussed herein can be implemented in connection with any devices with a need for improved continuous bandwidth coverage.

Aspects of this disclosure can be implemented in various electronic devices. For instance, one or more receivers implemented in accordance with any of the principles and advantages discussed herein can be included in various electronic devices. Examples of the electronic devices can include, but are not limited to, radar systems, radar detectors, consumer electronic products, parts of the consumer electronic products such as semiconductor die and/or packaged modules, electronic test equipment, wireless communication devices, medical devices and/or medical systems, industrial electronics systems, a vehicular electronics system such as an automotive electronics system, etc. Examples of the electronic devices can also include communication networks. The consumer electronic products can include, but are not limited to, a phone such as a smart phone, a laptop computer, a tablet computer, a wearable computing device such as a smart watch or an ear piece, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A wireless device having nonquadrature local oscillator mixing and continuous bandwidth coverage, the wireless device comprising:
a local oscillator circuit including a voltage controlled oscillator circuit and a divider circuit in communication with an output of the voltage controller oscillator circuit, the divider circuit being selectable between an integer division factors in a range from 4 to 7, the local oscillator configured to generate first and second carrier signals;

first and second mixer circuits configured to mix a radio frequency signal with the first and second carrier signals to generate first and second mixed signals, respectively; and an image correction circuit including first and second static offset circuits that are configured to apply a correction factor to the first and second mixed signals to correct static offset errors in response to the divider circuit being configured with the integer division factor in the range being an odd number;

wherein each of the first and second static offset circuits are selectable between a first configuration that is selected in response to the divider circuit being configured as a divide-by-5 divider, a second configuration that is selected in response to the divider circuit being configured as a divide-by-7 divider, and a third configuration that is selected in response to the divider circuit being configured as one of a divide-by-4 divider and a divide-by-6 divider.

2. The wireless device of claim 1 wherein the local oscillator circuit provides continuous octave bandwidth tuning.

3. The wireless device of claim 1 wherein the local oscillator circuit further comprises a divide-by 2 tree circuit configured to receive an output of the divider circuit.

4. The wireless device of claim 3 wherein the local oscillator circuit provides multi-decade bandwidth tuning.

5. The wireless device of claim 1 further comprising an antenna configured to transmit and receive radio frequency signals.

6. The wireless device of claim 1 wherein the first and second carrier signals are nonquadrature signals when the divider circuit is configured as the one of the divide-by-5 divider and the divide-by-7 divider.

7. The wireless device of claim 6 wherein the static offset errors are phase and amplitude errors caused by the nonquadrature signals.

8. The wireless device of claim 1 wherein the image correction circuit further includes a first residual offset circuit and a second residual offset circuit.

9. The wireless device if claim 8 wherein the first and second residual offset circuits include R-2R resistor stages that are configured to correct residual phase and amplitude errors of the first and second mixed signals.

10. The wireless device of claim 1 wherein in the voltage controlled oscillator circuit comprises only one voltage controlled oscillator.

11. A method to provide a wireless device with continuous bandwidth coverage, the method comprising:

selecting an integer division factor in a range from 4 to 7 in a divider circuit of a local oscillator circuit;

generating first and second local oscillator carrier signals with the local oscillator circuit;

mixing, with a mixer circuit, the first and second local oscillator carrier signals with a radio frequency signal to generate I and Q signals;

correcting an image attenuation of the I and Q signals by applying the I and Q signals to an image correction circuit that includes first and second static offset circuits that are each selectable; and selecting configurations of the first and second static offset circuits between a first configuration in response to the divider circuit being configured as a divide-by-5 divider, a second configuration that is selected in response to the divider circuit being configured as a divide-by-7 divider, and a third configuration that is selected in response to the divider circuit being configured as one of a divide-by-4 divider and a divide-by-6 divider.

12. The method of claim 11 further comprising selecting a tap of a divide-by-2 tree of the local oscillator circuit, an input of the divide-by-2 tree in communication with an output of the divider circuit.

13. The method of claim 11 wherein the first and second local oscillator carrier signals are nonquadrature signals when the divider circuit includes one of the divide-by-5 divider and the divide-by-7 divider, and wherein the image correction circuit is configured to reduce the image attenuation generated by the nonquadrature signals.

14. The method of claim 11 further comprising applying the I signal to a first residual offset correction circuit of the image correction circuit and applying the Q signal to a second residual offset correction circuit of the image correction circuit.

15. A wireless device having nonquadrature local oscillator mixing and continuous bandwidth coverage, the wireless device comprising:

a local oscillator circuit including a voltage controlled oscillator circuit and a divider circuit in communication with an output of the voltage controller oscillator circuit, the divider circuit being selectable between integer division factors in a range from 4 to 7, the local oscillator configured to generate first and second carrier signals;

first and second mixer circuits configured to mix a radio frequency signal with the first and second carrier signals to generate I and Q signals, respectively; and an image correction circuit comprising a first selectable static offset correction circuit configured to apply a first static correction factor to the Q signal and a second selectable static offset correction circuit configured to apply a second static correction factor to the I signal, the image correction circuit further comprising a first residual offset correction circuit configured to apply a first residual correction factor to the Q signal and a second residual offset correction circuit configured to apply a second residual correction factor to the I signal in response to the divider circuit comprising one of a divide-by-5 divider and a divide-by-7 divider.

16. The wireless device of claim 15 wherein the image correction circuit further comprises a summing circuit configured to sum outputs of the first and second selectable static correction circuits, outputs of the first and second residual correction circuits, and the Q signal.

17. The wireless device of claim 16 wherein the image correction circuit further comprises a first input resistor in series with a path of the Q signal and a second input resistor in series with a path of the I signal.

* * * * *

UNITED STATES PATENT AND TRADEMARK OFFICE
CERTIFICATE OF CORRECTION

PATENT NO. : 11,177,818 B2
APPLICATION NO. : 16/546753
DATED : November 16, 2021
INVENTOR(S) : Kearney It is certified that error appears in the above-identified patent and that said Letters Patent is hereby corrected as shown below:

In the Specification

Column 12, Line 43, delete "R2R" and insert --R-2R--.

Column 12, Line 59, delete "4.5 R" and insert --4.5R--.

In the Claims

Column 15, Line 44, Claim 9, delete "if" and insert --of --.

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*